United States Patent
Kuo et al.

(10) Patent No.: US 7,649,268 B2
(45) Date of Patent: Jan. 19, 2010

(54) SEMICONDUCTOR WAFER

(75) Inventors: Chien-Li Kuo, Hsin-Chu (TW);
Ping-Chang Wu, Hsin-Chu Hsien (TW);
Jui-Meng Jao, Miao-Li Hsien (TW);
Hui-Ling Chen, Kao-Hsiung Hsien (TW);
Kai-Kuang Ho, Hsin-Chu (TW);
Ching-Li Yang, Ping-Tung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 17 days.

(21) Appl. No.: 11/758,639

(22) Filed: Jun. 5, 2007

(65) Prior Publication Data

US 2008/0142798 A1 Jun. 19, 2008

Related U.S. Application Data

(62) Division of application No. 11/611,888, filed on Dec. 17, 2006, now Pat. No. 7,387,950.

(51) Int. Cl.
*H01L 29/40* (2006.01)
*H01L 23/544* (2006.01)

(52) U.S. Cl. ........................ 257/786; 257/620; 257/621

(58) Field of Classification Search ................. 257/786, 257/620, 621
See application file for complete search history.

(56) References Cited

U.S. PATENT DOCUMENTS

| 5,206,181 | A | 4/1993 | Gross |
| 5,477,062 | A | 12/1995 | Natsume |
| 2002/0149120 | A1* | 10/2002 | Sugiyama ............... 257/786 |
| 2006/0163699 | A1* | 7/2006 | Kumakawa et al. ......... 257/620 |

* cited by examiner

*Primary Examiner*—Howard Weiss
*Assistant Examiner*—Steven H Rao
(74) *Attorney, Agent, or Firm*—Winston Hsu

(57) ABSTRACT

A semiconductor wafer comprises a plurality of die areas, at least a first scribe line area and at least a second scribe line area surrounding each die area, at least a first metal structure positioned in the first scribe line area, and at least a second metal structure positioned in the second scribe line area. The first metal structure comprises at least a first slot split parallel to the first scribe line area, or comprises a plurality of openings arranged in an array. The second metal structure comprises at least a second slot split parallel to the second scribe line area, or comprises a plurality of openings arranged in an array.

10 Claims, 19 Drawing Sheets

SEMICONDUCTOR WAFER

CROSS REFERENCE TO RELATED APPLICATIONS

This divisional application claims the benefit of co-pending U.S. application Ser. No. 11/611,888, filed on Dec. 17, 2006 and included herein by reference.

BACKGROUND OF THE INVENTION

1. Field of the Invention

The present invention relates to a semiconductor wafer, and more specifically, to a semiconductor wafer that can avoid interlayer delamination caused by a wafer sawing process.

2. Description of the Prior Art

With the continued development of semiconductor process technology, and the miniaturization of the integrated circuit chip, many unneeded parasite capacitors are often formed in the inter-metal-dielectric (IMD) layer. Because the electrons cannot pass through the parasite capacitors until filling up the parasite capacitors, the signal transferred by the electrons is therefore delayed. That is what is called resistor-capacitor time delay effect. The resistor-capacitor time delay effect therefore becomes a limitation for raising the operation rate and the efficiency of the integrated circuit components. In order to increase the operation rate and the efficiency of the integrated circuit components, it is presently suggested that the resistances of conducting wires for the IMD layer should decrease, or the dielectric constant of the dielectric layers should decrease so as to mitigate the resistor-capacitor time delay effect. Therefore, copper with lower resistance is gradually used in place of aluminum with higher resistance to be the material of the IMD layer, and the low dielectric constant (low-k) materials are gradually used in place of the silicon oxide dielectric materials, such as fluorinated silicate glass (FSG), phosphosilicate glass (PSG), or undoped silicate glass (USG).

However, problems such as peeling or delamination are often found near the boundary between the copper and the low-k materials. After manufacturing the integrated circuit of the semiconductor wafers, the package factories should cut the wafers utilizing grinding wheels or cutters so as to perform the follow-up package processes. The mechanical internal stress is unavoidable during the mechanical cutting process, and causes cracks. Furthermore, peeling or delamination of the low-k materials is especially found when the scribe line area includes the copper and the low-k materials. This is a result of the properties of the copper and the low-k materials. The copper is fairly hard, and is more difficult to be cut in comparison with other materials in wafers. On the other hand, the low-k materials are soft or are porous structures, and the adhesion between the low-k materials and the other materials is rather poor. During the process of cutting, the grinding wheel or the cutter exerts a downward force upon the surface of the wafer. As the force is exerted on the metal pad with larger area, the whole metal pad compresses the low-k dielectric layer at its periphery. The compression leads to the peeling or the delamination of the low-k materials. As the peeling effect extends from the scribe line area to the drive circuit in the die area, it usually becomes a latent problem that damages the reliability of the final products.

Although there might be such a problem, the scribe line area cannot avoid including some metal materials with larger area, such as the metal pad. This is because the wafers should continuously be tested during manufacturing to maintain the quality of the products. At present, the wafer acceptance testing (WAT) is mostly accepted by the industry for testing wafers. It provides a plurality of test keys in the periphery area of two dies to monitor a variety of defects in the semiconductor processes. In other words, as the semiconductor processes are performed, a test component is formed in the scribe line area utilizing the same processes in the same time to simulate. The parameters of the processes are measured by utilizing a metal probe to contact the test keys, and those parameters are important indexes used to indicate the reliability of products. The mentioned test keys include metal structures in the scribe line areas. There are other metal structures in the scribe line areas, such as test components of feature dimension, alignment marks, or logos.

Please refer to FIG. 1 and FIG. 2. FIG. 1 is a schematic top view of a traditional wafer, and FIG. 2 is a schematic cross-section view of the traditional wafer of FIG. 1. As shown in FIG. 1, a wafer 10 includes a plurality of die areas 12 arranged in an array, a plurality of first scribe line areas 14 that are essentially parallel to each other, and a plurality of second scribe line areas 16 that are essentially parallel to each other. The first scribe line areas 14 are approximately perpendicular to the second scribe line areas 16 so as to divide each die area 12 from another. Furthermore, there is a passivation layer including a low-k dielectric layer 18 or IMD layer in the surface of the wafer 10 at present. There is at least a metal test structure 20 in the first scribe line areas 14 or the second scribe line areas 16, which can be any of the test keys, test components of feature dimension, alignment marks, or logos.

As mentioned above, after manufacturing the integrated circuit in the wafer 10, the package process starts. The grinding wheel or the cutter may cut the wafer 10 along the first scribe line areas 14 and the second scribe line areas 16 so as to cut the wafer 10 into a plurality of independent die areas 12. Generally speaking, the widths of the first scribe line areas 14 and the second scribe line areas 16 can be dependent on various factors, such as the size of the wafer, the cutting method and the kind of the integrated circuit, and are usually around ten micrometers to hundreds of micrometers.

As shown in FIG. 2, after cutting the wafer 10, the peeling or delamination are easily found near the boundary between the top low-k dielectric layer 18 and the lower other materials. Especially when the cutting force is exerted on the first scribe line areas 14 to the metal structure 20 with larger area, the whole metal structure 20 compresses the low-k dielectric layer 18 in the periphery. The compression leads to the peeling or the delamination of the low-k materials. Those effects are easily transferred along the direction perpendicular to the cutting direction, and the peeling of the low-k dielectric layer 18 might extend to the inter-metal layer of the die area 12, thereby damaging the operation of the integrated circuit in the dies.

SUMMARY OF THE INVENTION

It is therefore an objective of the claimed invention to provide a semiconductor wafer, in order to avoid the interlayer delamination caused by the wafer sawing process.

According to the claimed invention, a semiconductor wafer comprises a plurality of die areas, at least a first metal structure, and at least a second metal structure. Each die area is surrounded by at least a first scribe line area and at least a second scribe line area. The first metal structure in the first scribe line area comprises at least a first slot split parallel to the first scribe line area or comprises a plurality of openings arranged in an array. The second metal structure in the second scribe line area comprises at least a second slot split parallel to the second scribe line area or comprises a plurality of openings arranged in an array.

According to another claimed invention, a method for forming a semiconductor wafer is provided. First, a semiconductor wafer is provided that defines a scribe line area, and the scribe line area comprises at least a first low-k dielectric layer. Subsequently, a first metal layer is formed in the first low-k dielectric layer in the scribe line area, and the first metal layer comprises at least a slot split parallel to the scribe line area. Thereafter, a second low-k dielectric layer is formed in the scribe line area, and the second low-k dielectric layer comprises a plurality of slot via holes to expose portions of the first metal layer. Finally, a second metal layer and a plurality of via strips are formed. The second metal layer is on a surface of the second low-k dielectric layer, and the via strips fill up the slot via holes. The second metal layer is electrically connected to the first metal layer by the via strips.

Because the metal structures of the present invention include the slot split or include the openings arranged in an array, they can prevent the peeling and the interlayer delamination of material layers, and effectively protect the dies from damage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
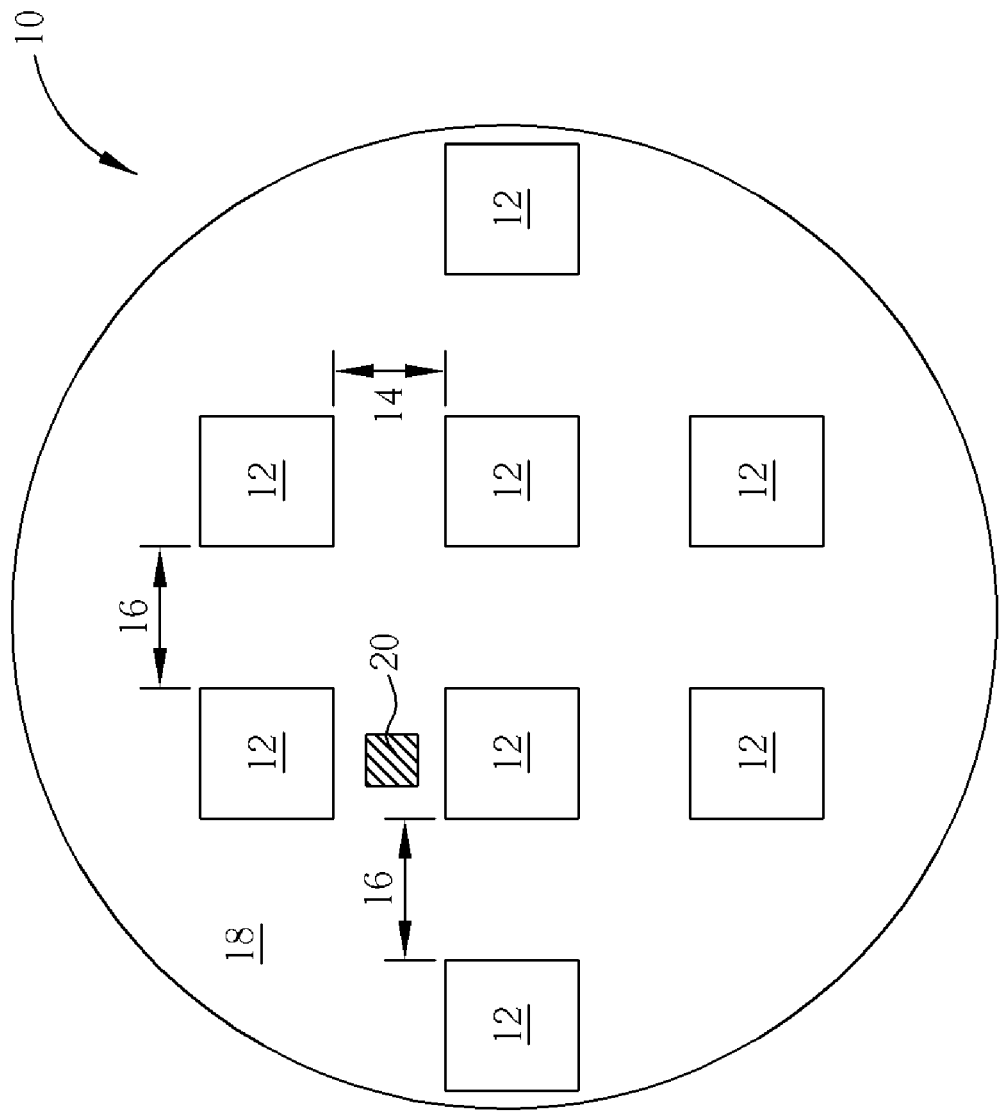
FIG. 1 is a schematic top view of a traditional wafer.
Figure 2:
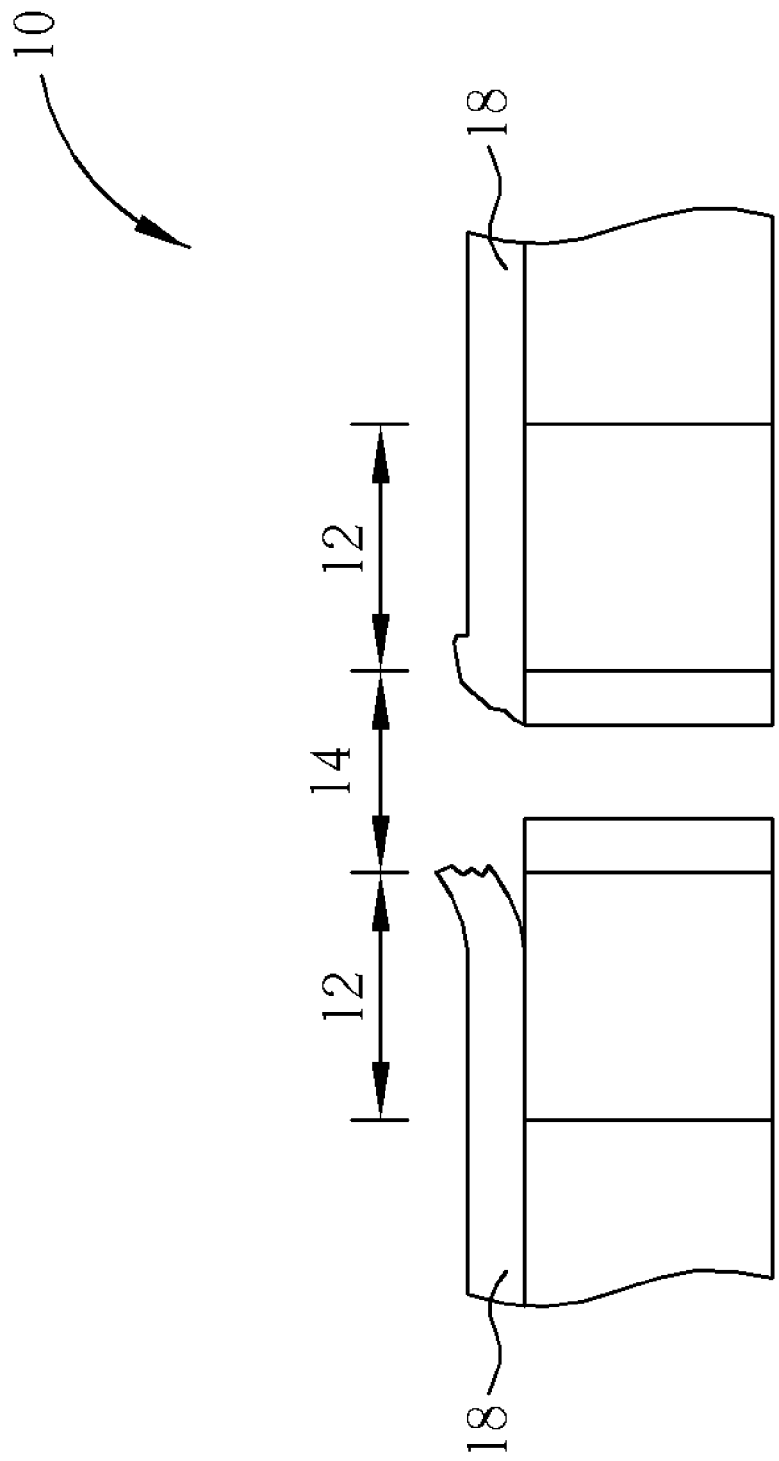
FIG. 2 is a schematic cross-section view of the traditional wafer of FIG. 1.
Figure 3:
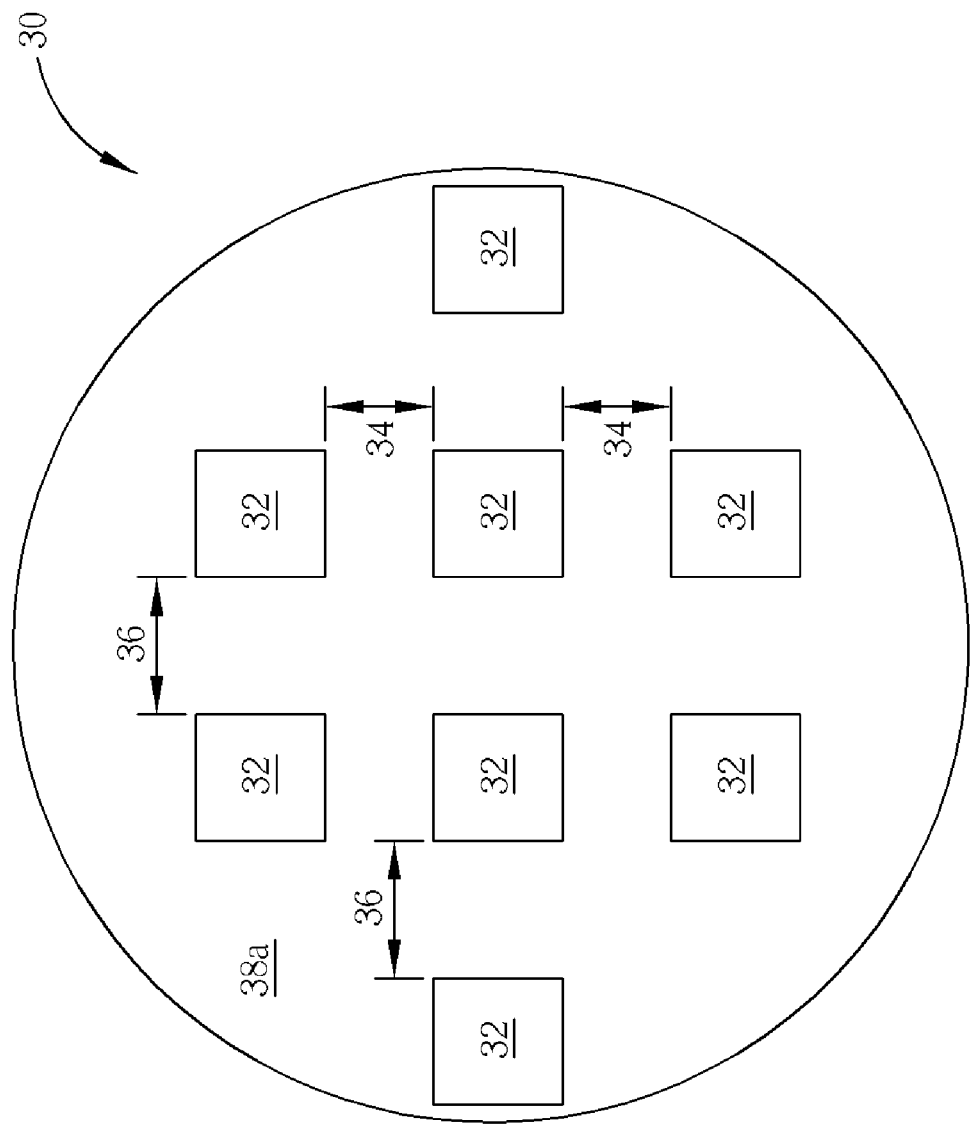
FIG. 3 through FIG. 6 shows a method for forming a semiconductor wafer according to a preferred embodiment of the present invention.
Figure 5:
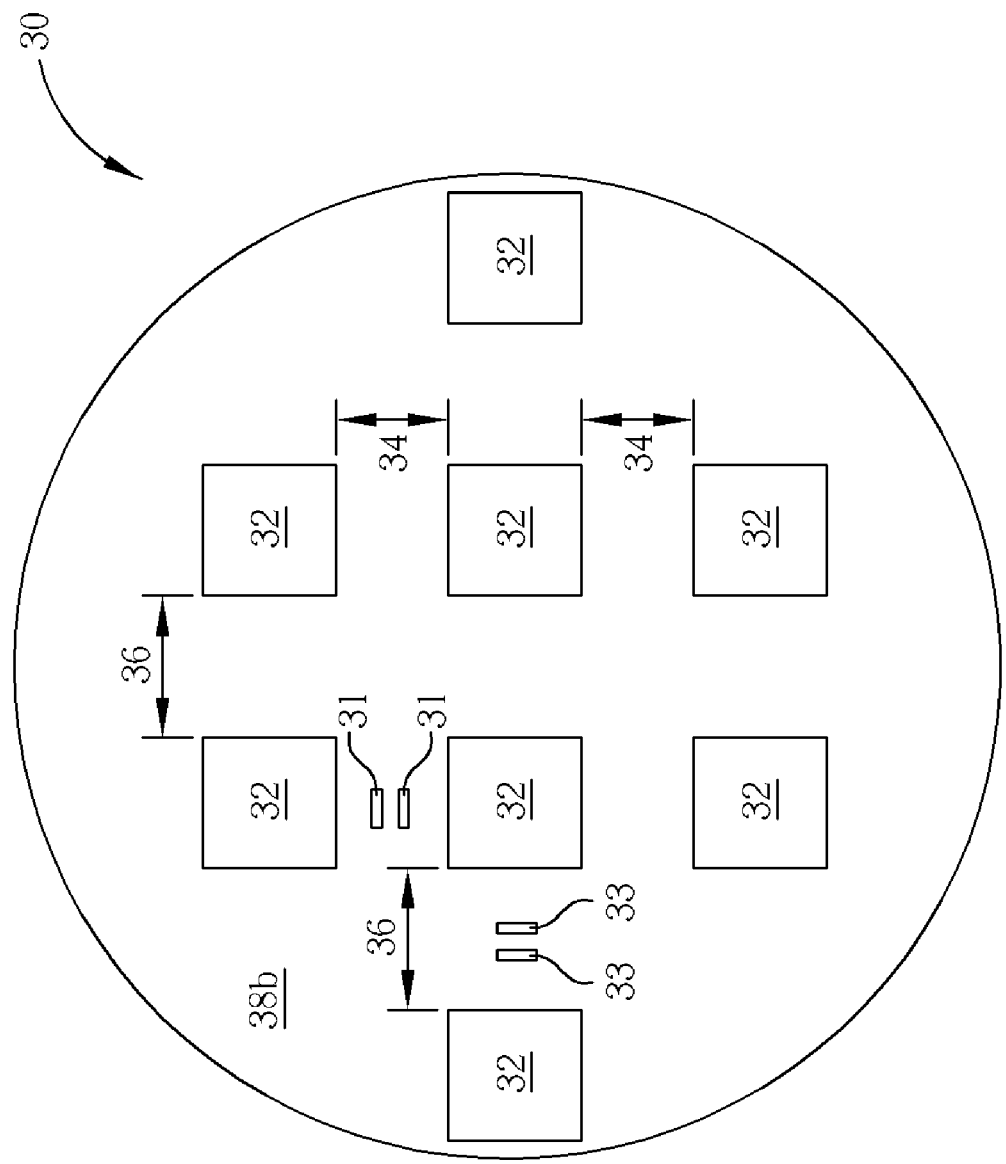
Figure 6:
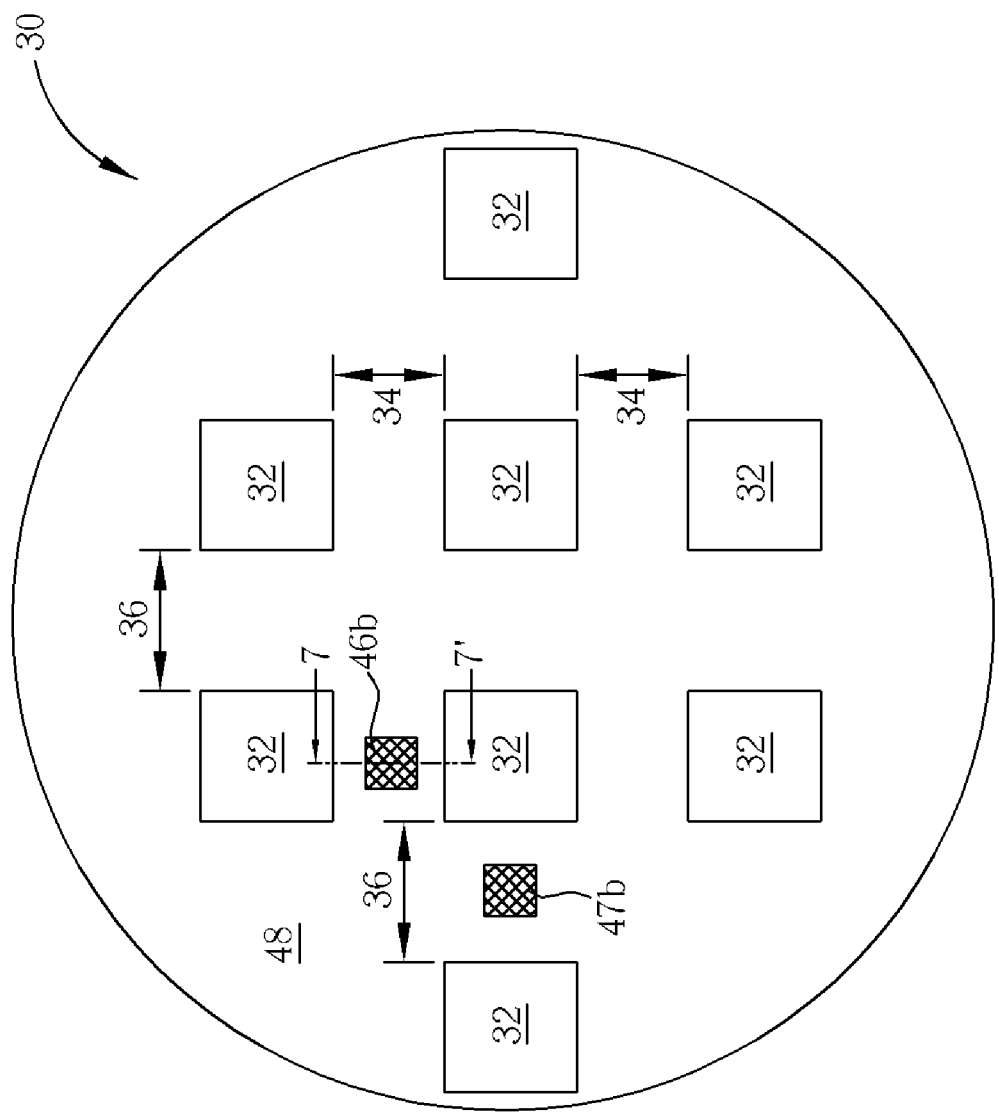
Figure 7:
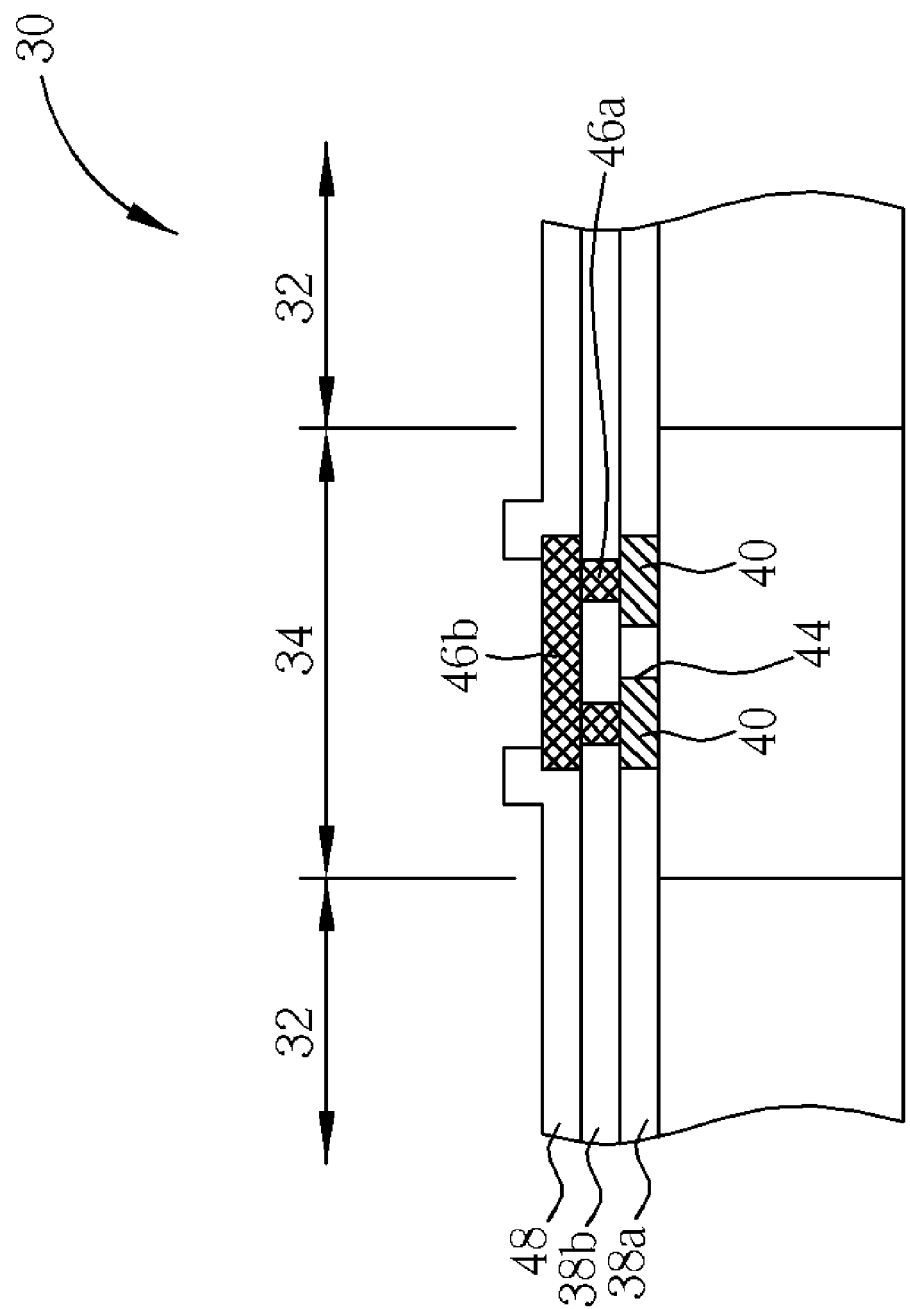
FIG. 7 is a schematic cross-section view of a cross line 7-7' of the semiconductor wafer from FIG. 6.

Please refer to FIG. 3 through FIG. 7. FIG. 3 through FIG. 6 shows a method for forming a semiconductor wafer according to a preferred embodiment of the present invention, and FIG. 7 is a schematic cross-section view of a cross line 7-7' of the semiconductor wafer from FIG. 6. As shown in FIG. 3, the semiconductor wafer 30 of the present invention comprises at least a first low-k dielectric layer 38a, a plurality of die areas 32, a plurality of first scribe line areas 34 essentially parallel to each other, and a plurality of second scribe line areas 36 essentially parallel to each other. In this case, there is an integrated circuit in each die area 32. The integrated circuit includes a variety of electric components and conductive circuits, such as transistors, capacitors, diodes, diffusions, memory arrays or interconnections. The first scribe line areas 34 are approximately perpendicular to the second scribe line areas 36 as a reticular scribe line area to divide each die area 32 from another.

Figure 4:
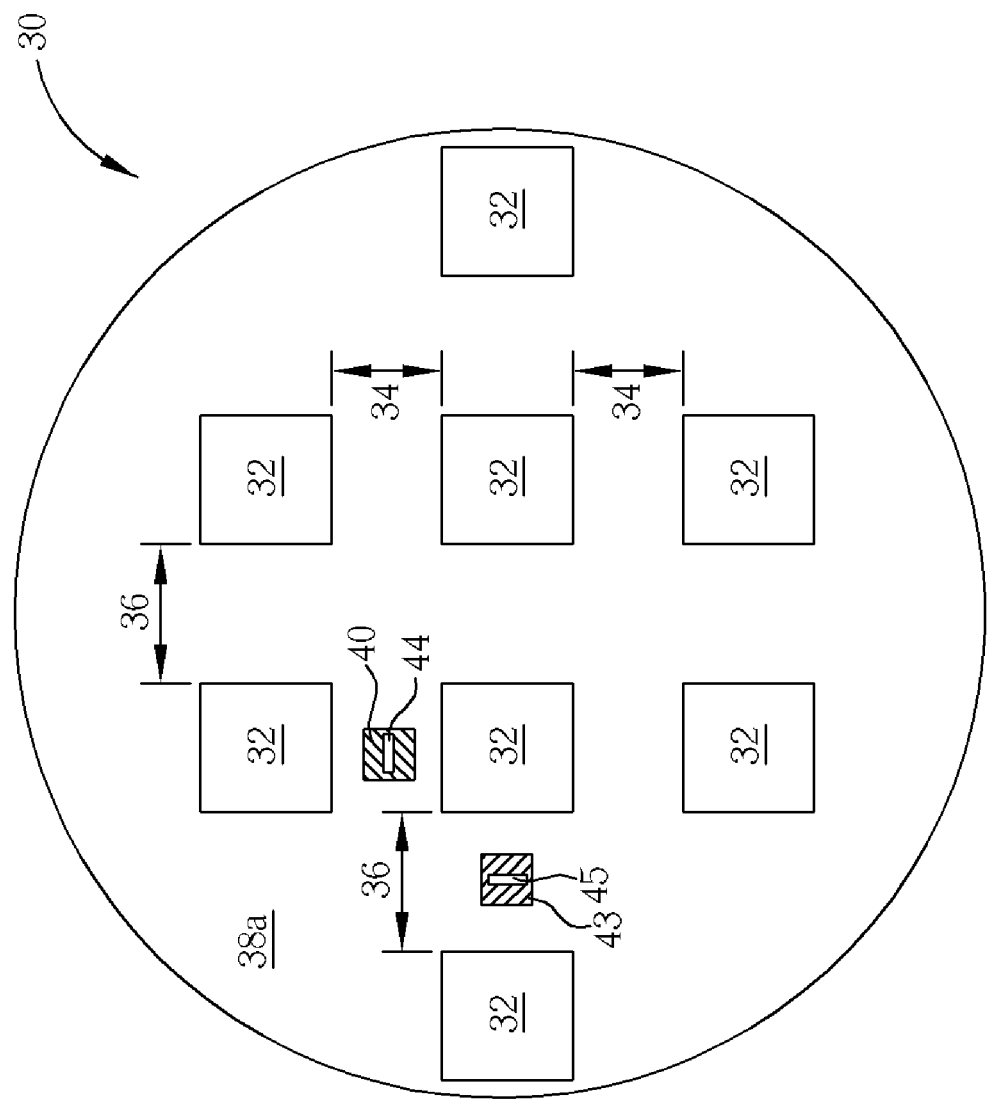

Subsequently, as shown in FIG. 4, a metal deposition process is performed to form the top metal lines (not shown in the figure) in each die area 32, a first rectangular metal layer 40 in the first low-k dielectric layer 38a of the first scribe line area 34, and a first rectangular metal layer 43 in the first low-k dielectric layer 38a of the second scribe line area 36. For example, a first metal layer 40 is inlayed into the first scribe line area 34 by a copper deposition process in this preferred embodiment. The first metal layers 40, 43 include at least a slot split 44 parallel to the first scribe line area 34, and at least a slot split 45 parallel to the second scribe line area 36 respectively. The shape, the length, and the width of the slot splits 44, 45 are dependent on the designed size of the first metal layer 40, the first scribe line areas 34, and the second scribe line areas 36.

As shown in FIG. 5, thereafter, a second low-k dielectric layer 38b is formed covering the die areas 32, the first scribe line areas 34, and the second scribe line areas 36. Subsequently, a via hole etching process is performed to form a plurality of slot via holes 31 parallel to the first scribe line area 34, and a plurality of slot via holes 33 parallel to the second scribe line areas 36 in the second low-k dielectric layer 38b so as to expose portions of the first metal layer 40, 43 respectively.

Next, as shown in FIG. 6, a metal deposition process is performed to form a metal layer (not shown in the figure) on a surface of the second low-k dielectric layer 38b, and to form a plurality of via strips 46a filling up the slot via holes 31, 33 in the first scribe line areas 34 and the second scribe line areas 36. Next, the metal layer is etched by an etching process to form a second metal layer 46b in the first scribe line areas 34, and a second metal layer 47b in the second scribe line areas 36 on the surface of the second low-k dielectric layer 38b. Furthermore, a passivation layer 48 is formed on a surface of whole semiconductor wafer 30, and the passivation layer 48 is patterned by an etching process to expose portions of the second metal layer 46b, 47b to complete the manufacturing process of the metal structure of the present invention. The first low-k dielectric layer 38a, the second low-k dielectric layer 38b, and the passivation layer 48 can include dielectric materials, such as FSG, PSG, USG, hydrogen silsequoxiane (HSQ), and methyl silsequoxiane (MSQ). The first metal layer 40, 43, the via strips 46a, and the second metal layer 46b, 47b can include titanium, tantalum, tungsten, aluminum, copper, titanium nitride, tantalum nitride, or an alloy thereof. In addition, the processes, such as the metal deposition process and the etching process are also performed on each die area 32 to form some structures, such as the top metal lines, bonding pad, etc. This is well known by a person skilled in this art, so the unnecessary details are not given.

Figure 8:
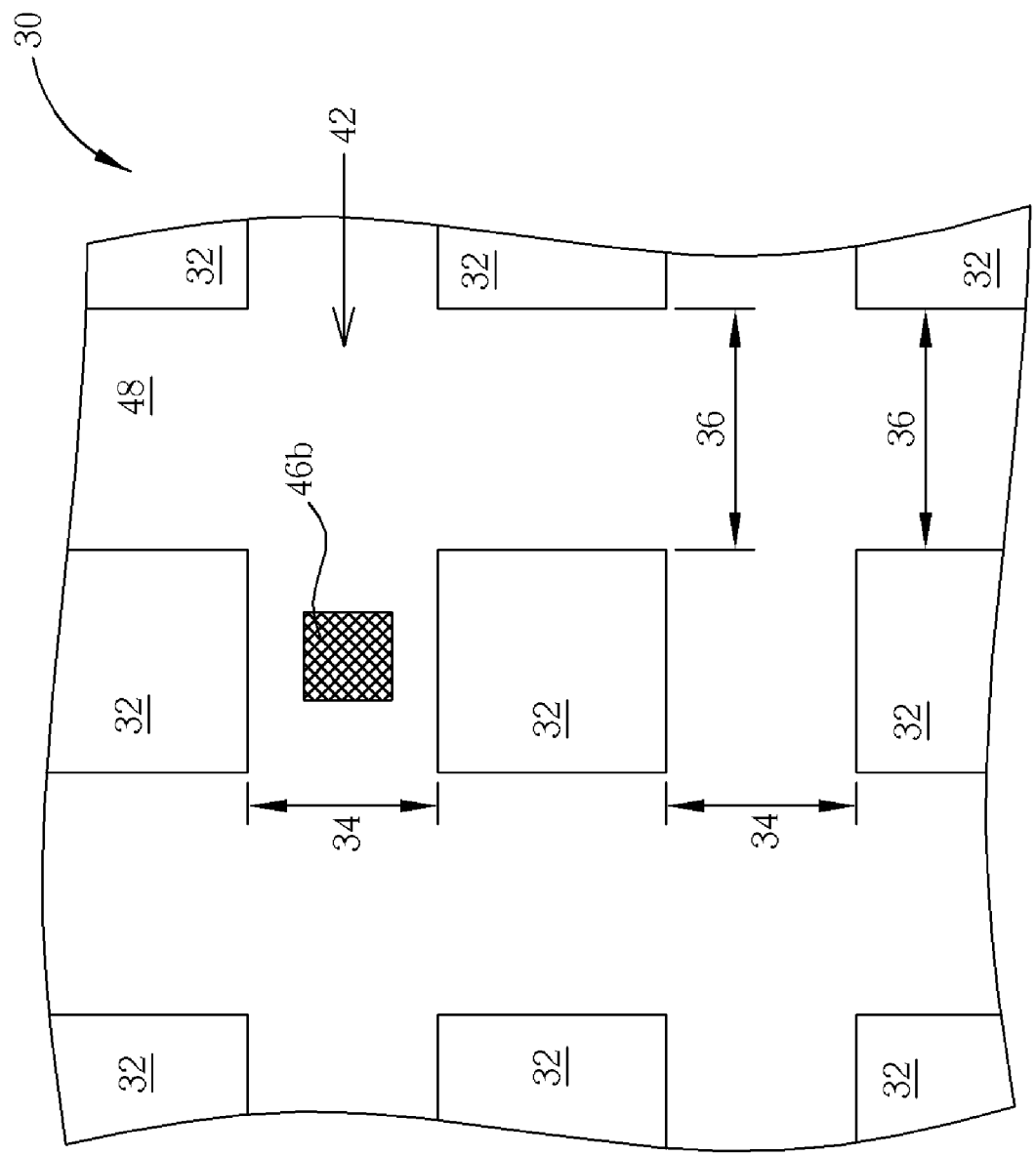
FIG. 8 is a schematic top view of the semiconductor wafer.

Please refer to FIG. 8. FIG. 8 is a schematic top view of the semiconductor wafer. As shown in FIG. 8, the semiconductor wafer 30 includes the die areas 32, the first scribe line areas 34, the second scribe line areas 36, the passivation layer 48, and the second metal layer 46b. The second metal layer 46b is electrically connected to the lower via strips 46a and the first metal layer 40. The first metal layer 40 includes at least a slot split 44 parallel to the first scribe line areas 34, as shown in FIG. 7. Besides, a die sawing direction 42 is a predetermined direction for the mechanical cutter to cut along, and the die sawing direction 42 is approximately parallel to the first scribe line areas 34.

As above, when the package plant utilizes the mechanical cutter to cut the semiconductor wafer along the scribe line area, it will cause the semiconductor wafer to sustain a large stress. Because the mechanical strengths of metal materials are usually high, it is more difficult to cut the metal materials than to cut the materials with the lower mechanical strengths. If the mechanical cutter cuts a metal pad without any opening, the mechanical cutter should provide more force, and this region has to sustain a larger stress in response. On the contrary, each metal structure of the present invention in the scribe line area includes at least a slot split parallel to the scribe line area. The cutting area of the first metal layer 40 to be destroyed by the mechanical cutter is decreased because of the slot split 44. Thus, the probabilities of peeling and delamination between the low-k materials and other materials can be decreased.

On the other hand, because it is easy to find local stress concentration in the region, such as a terminal point, an inflection point, or a branch point of material layer, each metal structure of the present invention in the scribe line area includes at least a slot split parallel to the scribe line area so as to make the sawing process easier. When the local stress concentration occurs in the material, the slot split sustains more stress than the other region of the material. It means that before the average stress of material reaches the value of the fracture strength, the stress of the region with slot split has already reached the value of the fracture strength. Thus, it makes the sawing process easier, and prevents the peeling and the interlayer delamination of material layers. For example, when the mechanical cutter cuts the first metal layer 40 along the die sawing direction 42, the stress might concentrate in the terminal points of the slot split 44. Part of the cutting stress is transferred from the periphery interface between the first metal layer 40 and the low-k dielectric layer 38a, 38b to the slot split 44 of the first metal layer 40. As a result, cutting the first metal layer 40 is easier. In addition, the slot splits 44, 45 of the first metal layers 40, 43 can be the crack stress stoppers to prevent the cracks form extending from the scribe line areas to the integrated circuits in the die areas.

Figure 9:
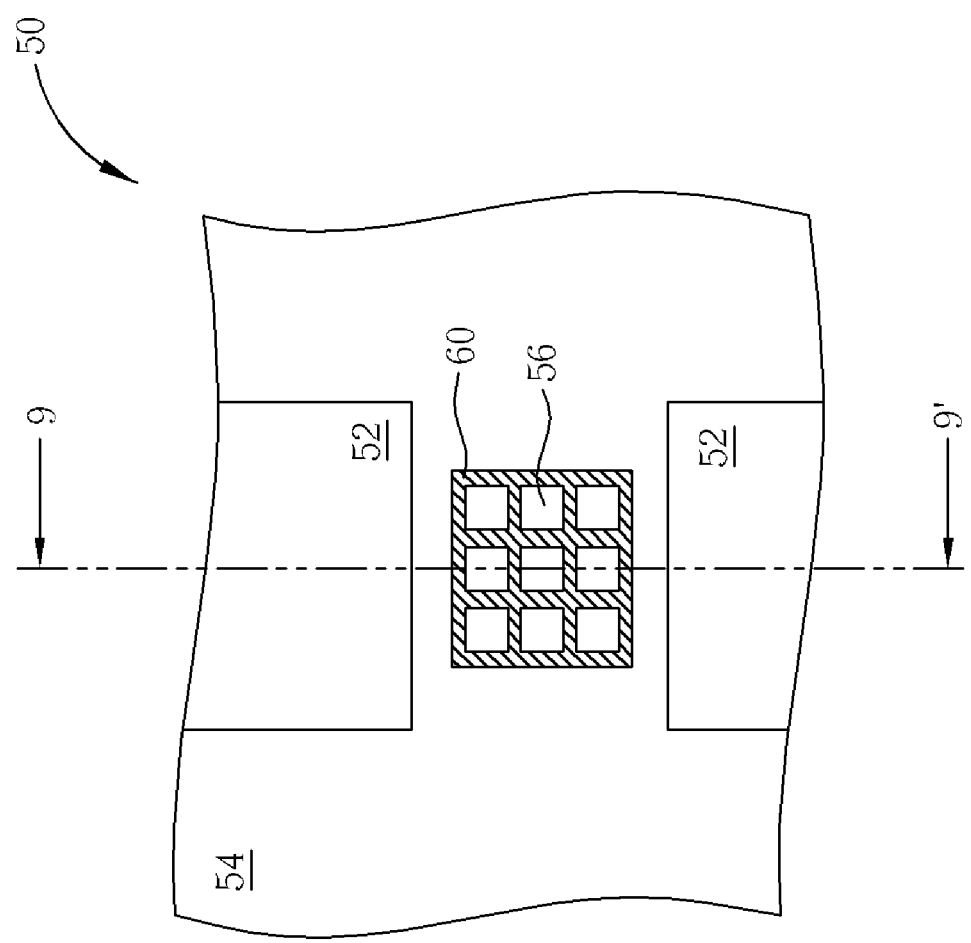
FIG. 9 is a schematic top view of portion of the semiconductor wafer according to another preferred embodiment of the present invention.
Figure 10:
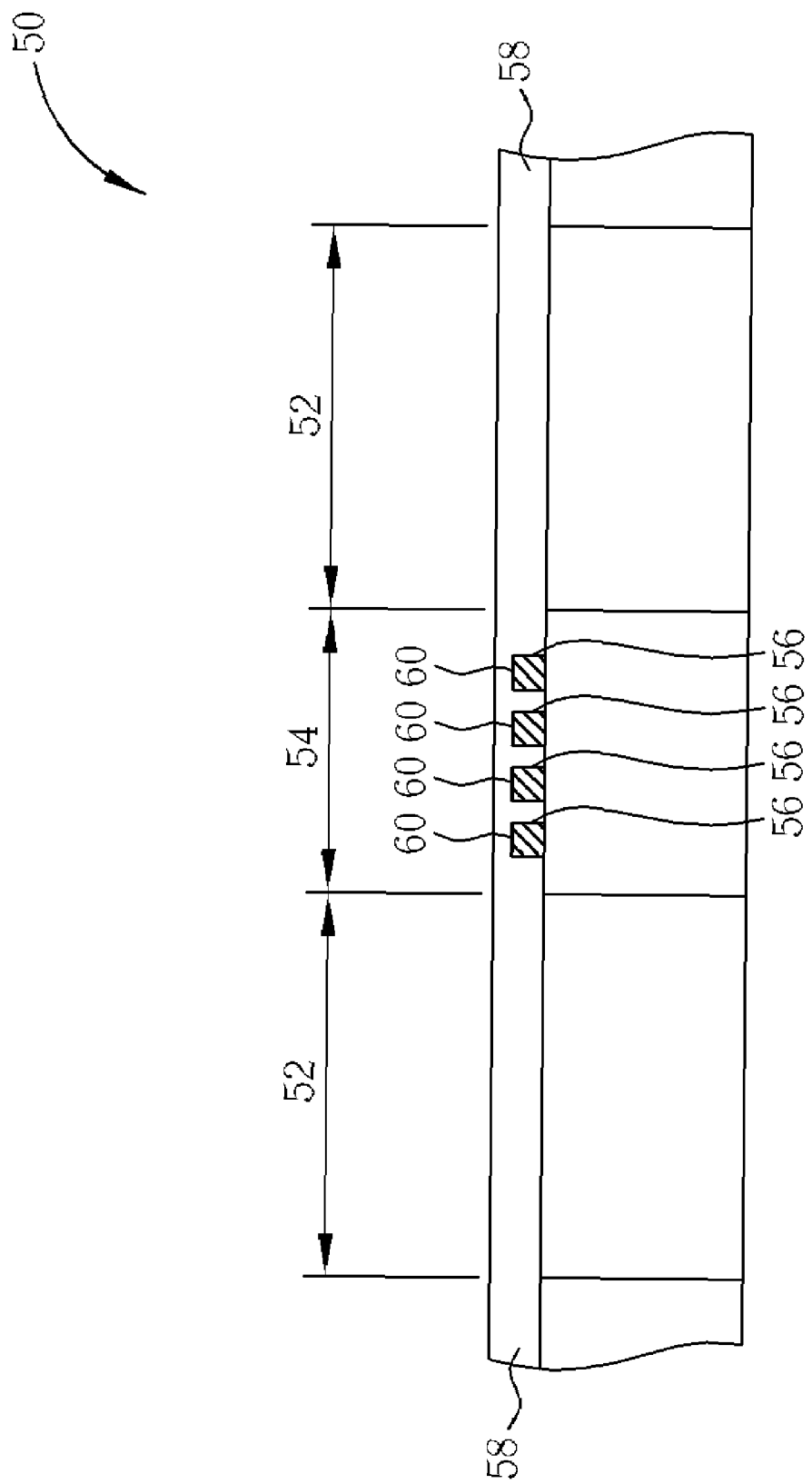
FIG. 10 is a schematic cross-section view of a cross line 9-9' of the semiconductor wafer from FIG. 9.

Please refer to FIG. 9 and FIG. 10. FIG. 9 is a schematic top view of portion of the semiconductor wafer according to another preferred embodiment of the present invention, and FIG. 10 is a schematic cross-section view of a cross line 9-9' of the semiconductor wafer from FIG. 9. As shown in FIG. 9 and FIG. 10, the semiconductor wafer 50 includes a plurality of die areas 52 (the figure only shows two die areas 52 for easier explanation), one or more scribe line areas 54, at least a metal structure 60 in the scribe line areas 54, and at least a passivation layer 58 covering the metal structure 60 and the scribe line areas 54. Each die area 52 includes a variety of electric components and conductive circuits, such as transistors, capacitors, diodes, diffusions, memory arrays or interconnections. Besides, the metal structure 60 includes titanium, tantalum, tungsten, aluminum, copper, titanium nitride, tantalum nitride, or an alloy thereof to apply as a test key, a test component of feature dimension, an alignment mark, a logo, or a WAT pad. It deserves to be mentioned that, in order to prevent the stress from causing damage, the metal structure 60 of this preferred embodiment includes a plurality of openings arranged in an array, for example, nine openings 56 shown in FIG. 9. The amount, shape, the length, and the width of the openings 56 are dependent on the needed design of the metal structure 60 and the scribe line areas 54, and they are not limited by this preferred embodiment.

In this preferred embodiment, the metal structure 60 includes the openings 56 arranged in an array. In general, the cutting area, which needs to be destroyed by the mechanical cutter, is decreased, and the probabilities of peeling and delamination between the low-k materials and other materials are also decreased. Besides, when the mechanical cutter cuts the metal structure 60, the openings 56 can be the crack stress stoppers to prevent the cracks from extending from the scribe line areas to the integrated circuits in the die areas.

The above figures are applied for illustrating the present invention, not for limiting the present invention. It deserves to be mentioned that the metal structure of the present invention not only can be positioned on the surface of the semiconductor wafer as is mentioned above, but can also be positioned in any of the interconnection metal layers in the scribe line to test the reliabilities of the processes for manufacturing the semiconductor wafers. Furthermore, the metal structures of the present invention can only be positioned in one interconnection metal layer of scribe line areas with a single direction. For example, the metal structures only are positioned in the scribe line areas with X-direction, or only are positioned in the scribe line areas with Y-direction.

Figure 11:
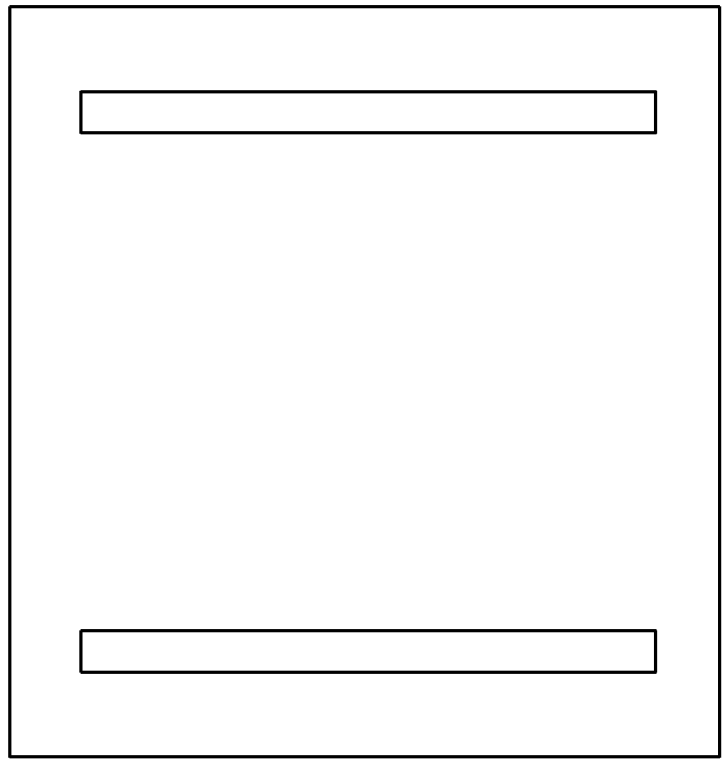
FIG. 11 to FIG. 14 schematically depict different embodiments of the metal structures.
Figure 12:
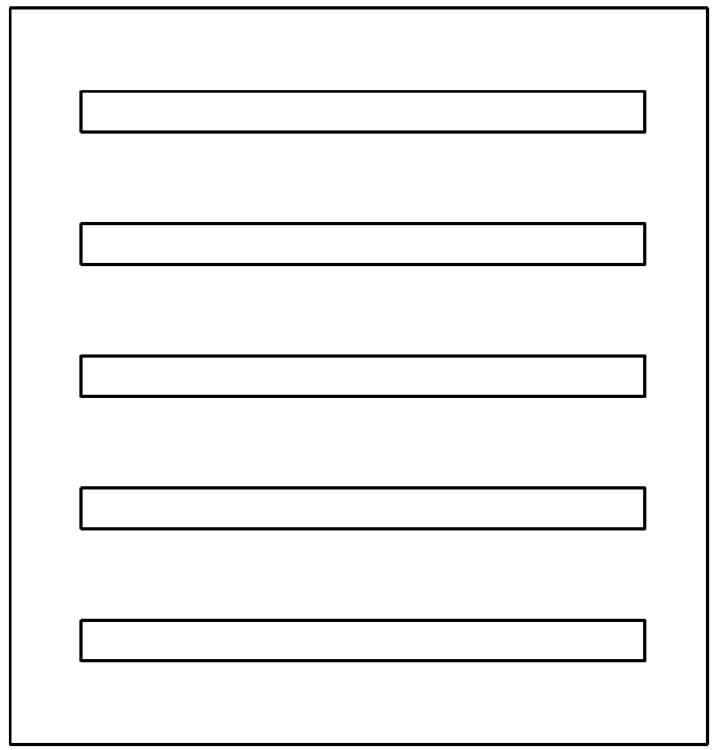
Figure 13:
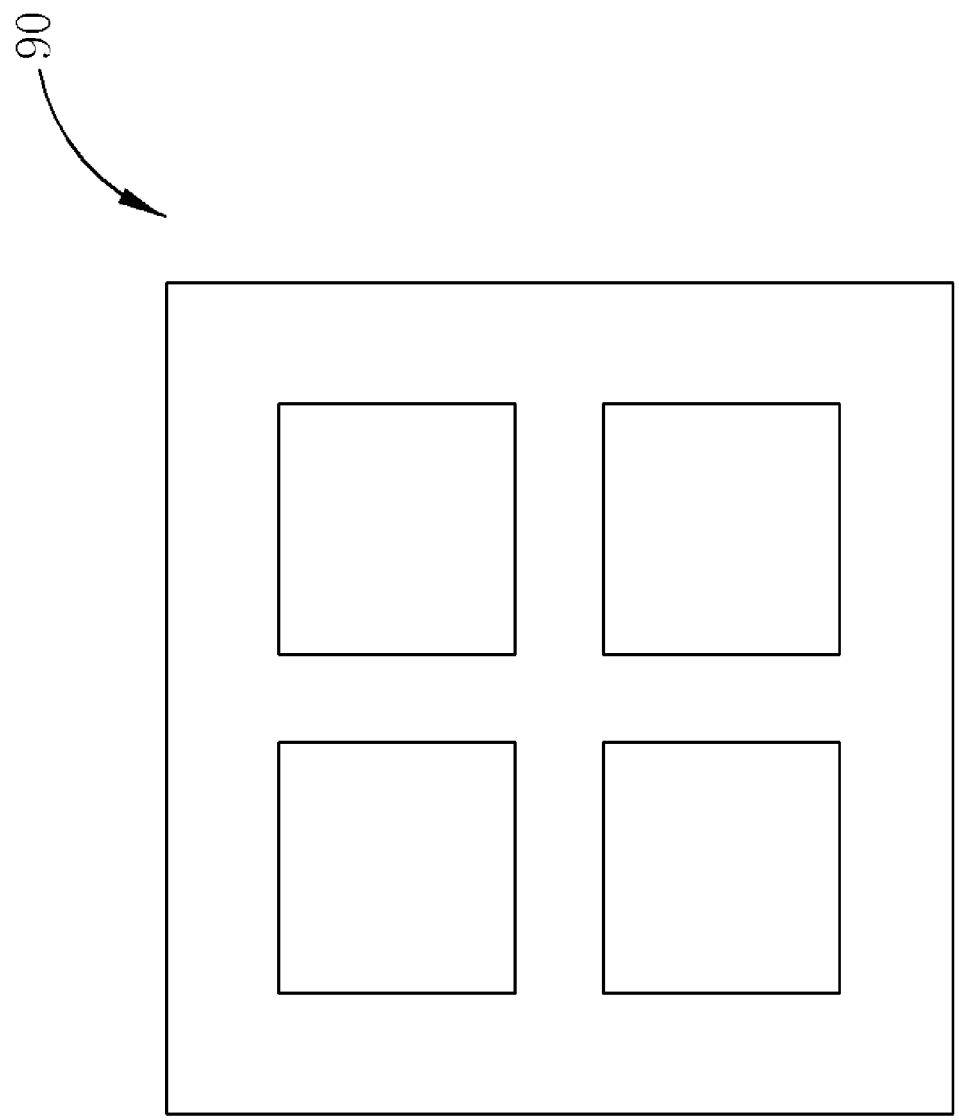
Figure 14:
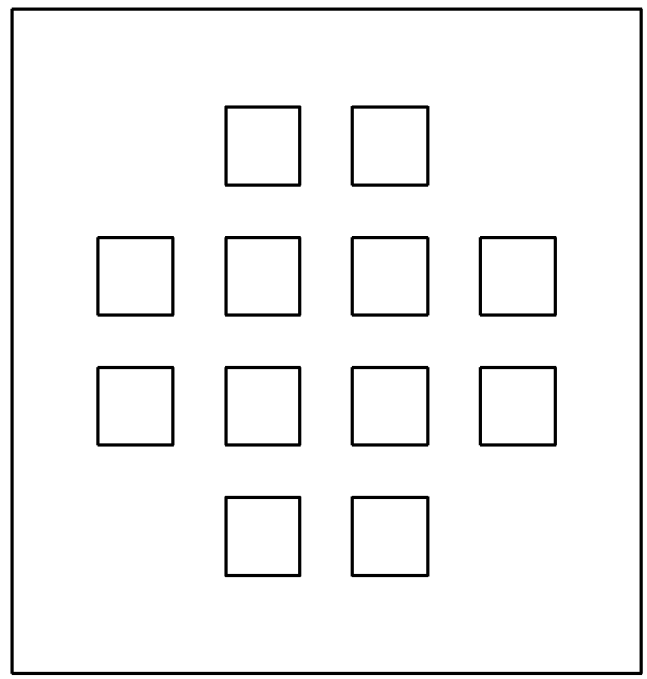

In the aforementioned embodiments, a metal structure with a slot split, or a metal structure with nine openings arranged in an array have been described. However, other metal structures can also be selected. For instance, FIG. 11 to FIG. 14 schematically depict different embodiments of the metal structures. Specifically speaking, FIG. 11 depicts a metal structure 70 with two slot splits. FIG. 12 depicts a metal structure 80 with five slot splits. FIG. 13 depicts a metal structure 90 with four openings arranged in an array. FIG. 14 depicts a metal structure 100 with twelve openings arranged in an array.

Because the above-mentioned slot splits and openings lie across the central portion of the metal structure, the central portion of the metal structure is no longer a complete and continues metal. As a result, the occurring probability of interlayer delamination is decreased. Additionally, in order to enhance the protecting ability of the present invention, it is therefore a design of the metal structure further including slot splits in its periphery portion which surrounds the central portion of the metal structure. The design can turn the periphery portion of the metal structure into a non-continuous structure. The non-continuous structure can be corresponding to FIG. 15 through FIG. 19 which are schematic diagrams of the metal structures including a variety of non-continuous peripheries.

Figure 15:
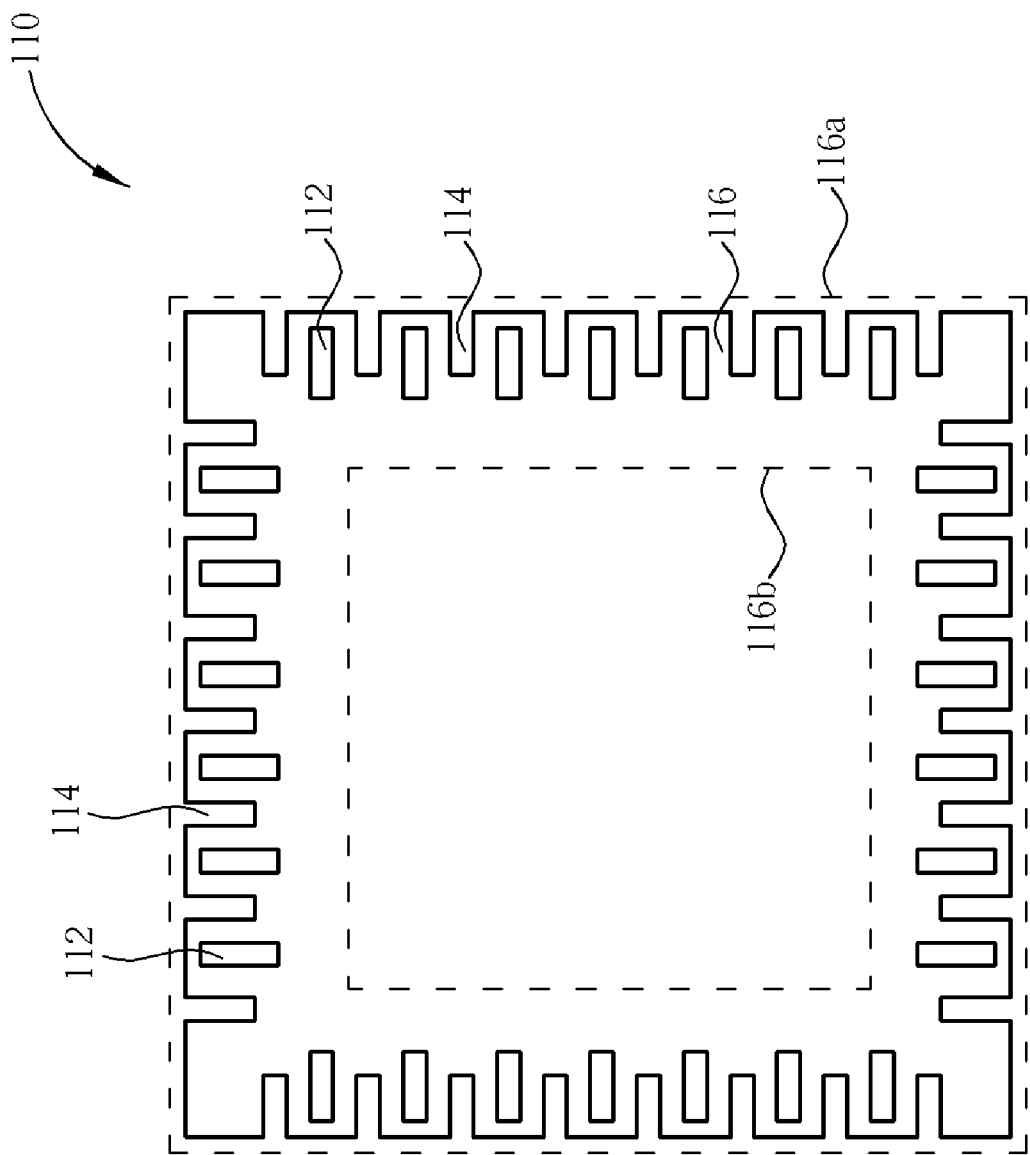
FIG. 15 to FIG. 19 are schematic diagrams of the metal structures including a variety of non-continuous peripheries.

As shown in FIG. 15, it illustrates a metal structure 110 including a non-continuous periphery. The metal structure 110 is a rectangular pad including a plurality of staggered slots 112 and a plurality of marginal slots 114 in its periphery portion (the periphery portion is a region inside a dotted line 116a and outside a dotted line 116b). The staggered slots 112 are substantially perpendicular to the corresponding four sides of the metal structure 110, and positioned inside the metal structure 110. The marginal slots 114 extend inward from the four sides of the metal structure 110, and positioned between every two staggered slots 112. Because the staggered slots 112 and the marginal slots 114 are arranged alternately, the periphery portion of the metal structure 110 becomes a non-continuous structure 116.

Figure 16:
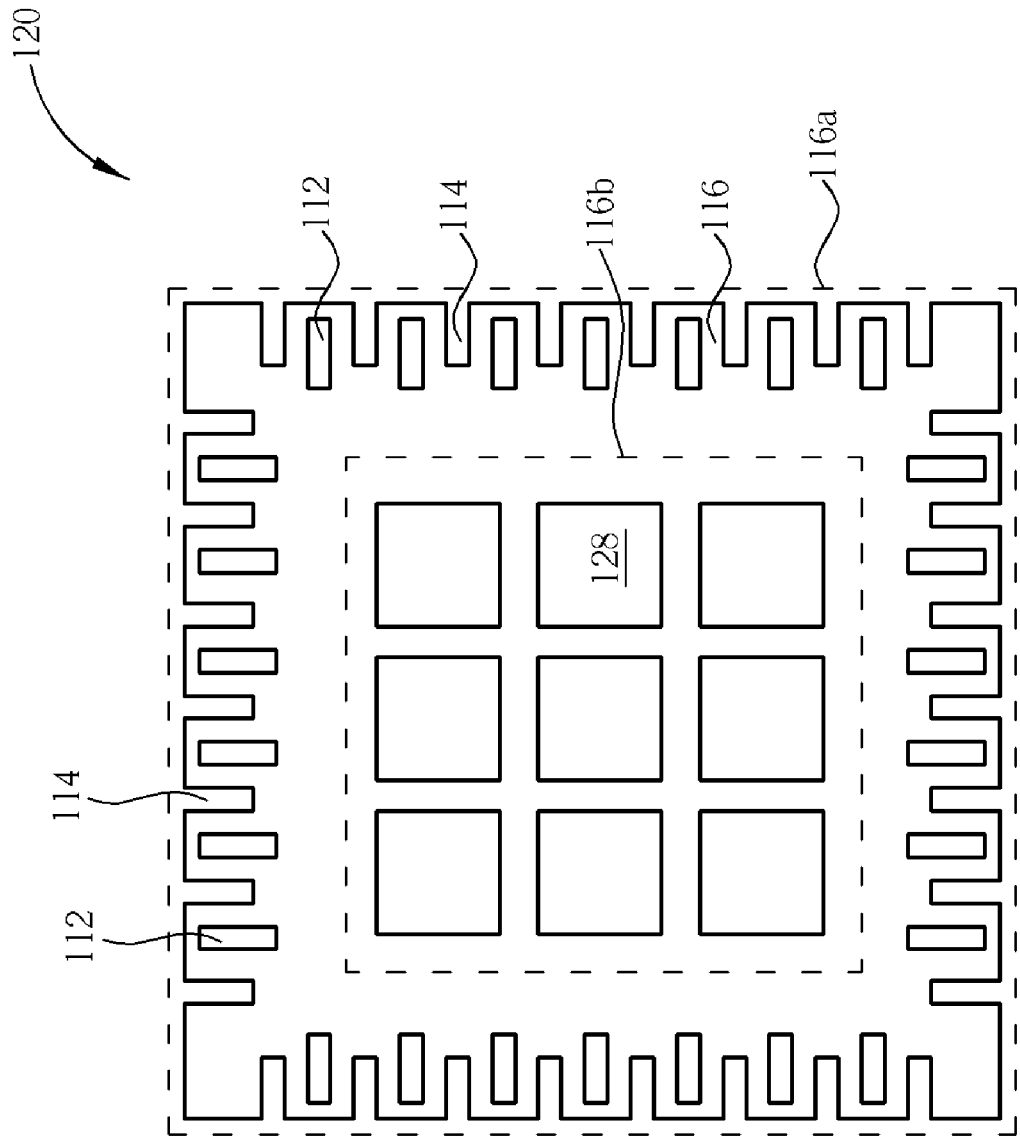
Figure 17:
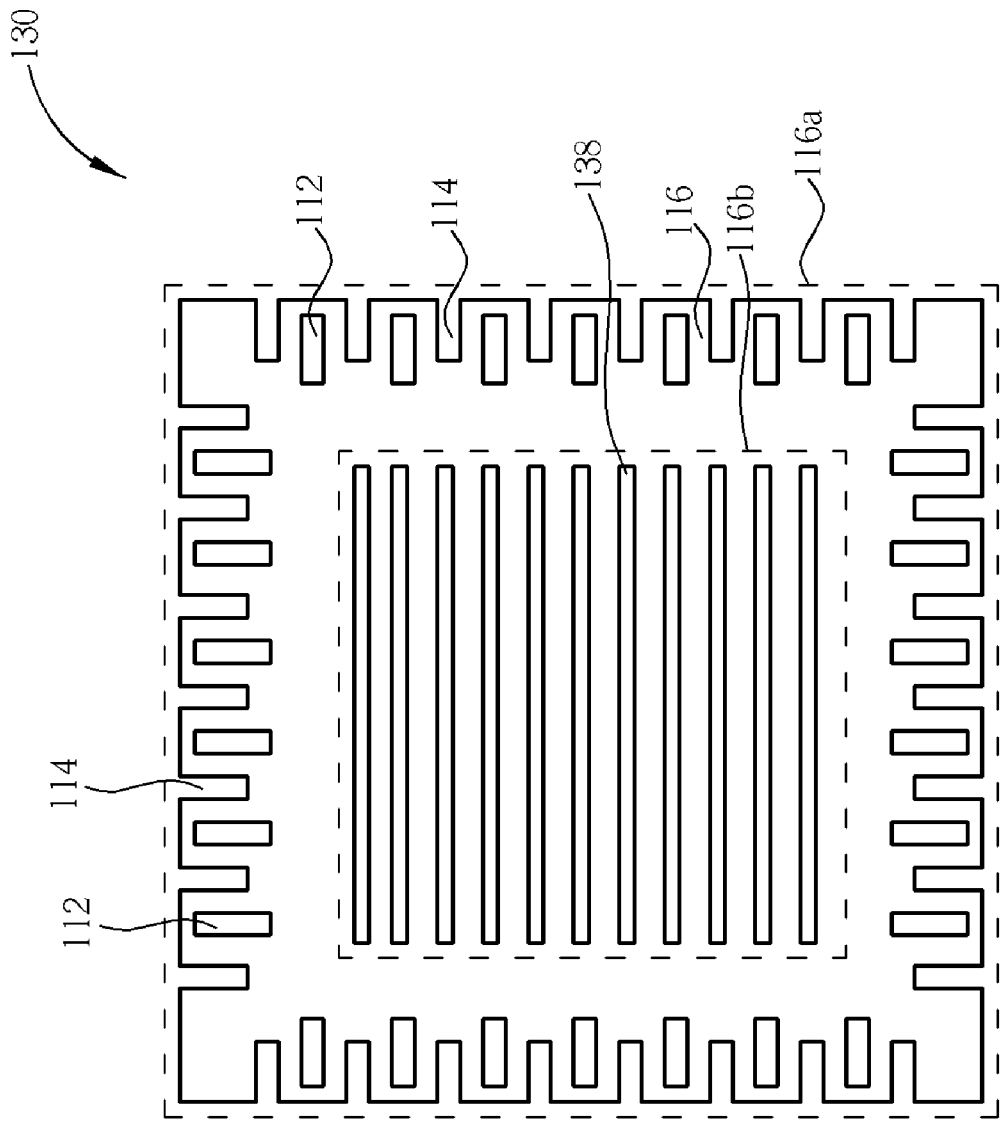

FIG. 16 illustrates a metal structure 120 including a non-continuous periphery and a plurality of openings 128. As shown in FIG. 16, the periphery portion of the metal structure 120 includes the non-continuous structure 116 shown in FIG. 15, and the central portion of the metal structure 120 includes a plurality of openings 128 arranged in an array. FIG. 17 illustrates a metal structure 130 including a non-continuous periphery and a plurality of central slots 138. The periphery portion of the metal structure 130 includes the non-continuous structure 116 shown in FIG. 15, and the central portion of the metal structure 130 includes a plurality of central slots 138 parallel to parallel to the scribe line.

Figure 18:
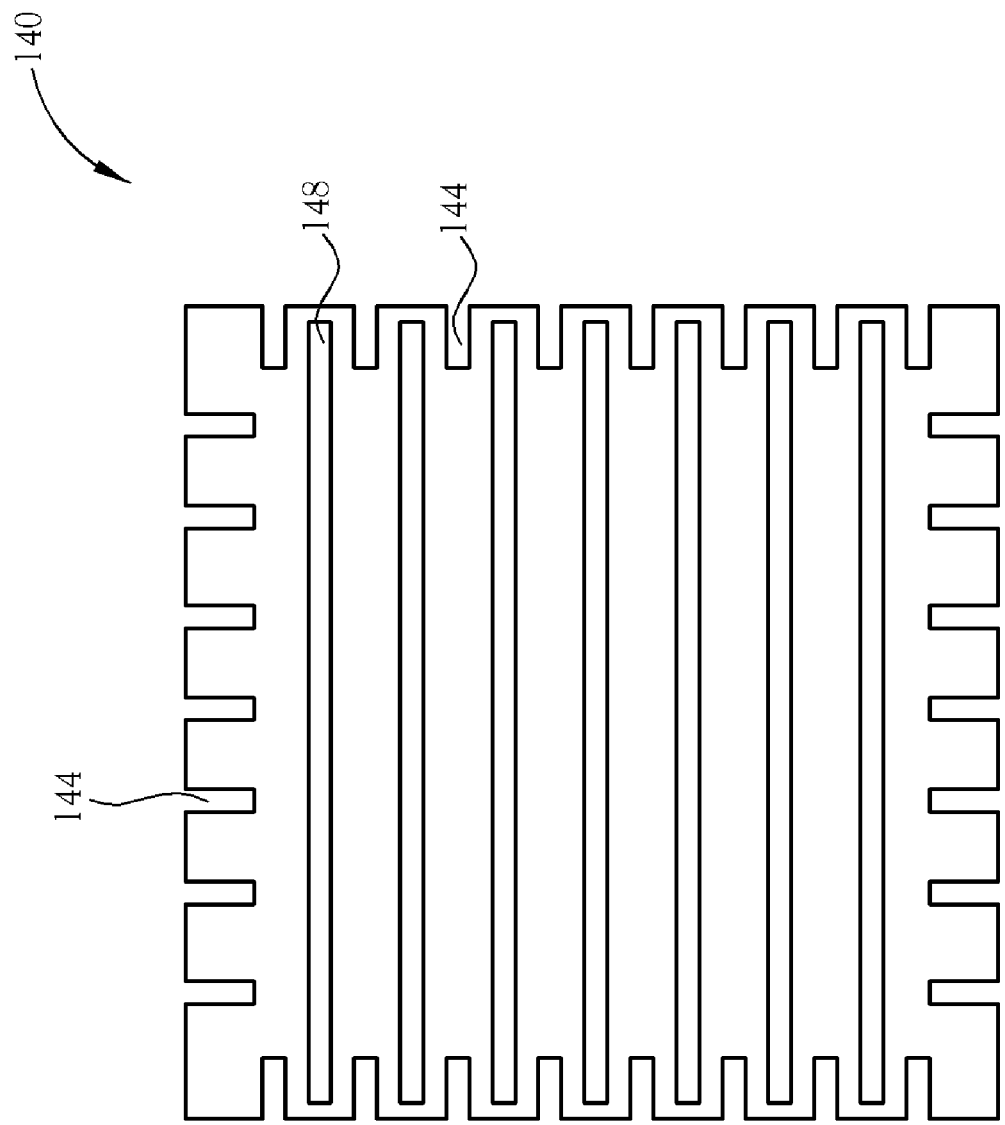

FIG. 18 illustrates a metal structure 140 including a non-continuous periphery and a plurality of central slots 148. As shown in FIG. 18, the central portion of the metal structure 140 includes a plurality of central slots 148 parallel to the scribe line, and the periphery portion of the metal structure 140 includes a plurality of marginal slots 144. The marginal slots 144 extend inward from the four sides of the metal structure 140. It deserves to be mentioned that, two ends of each central slot 148 are extend outward to two opposite sides of the metal structure 140, and each end of each central slot 148 is extend to the positions between the marginal slots 144. As a result, the central slots 148 and the marginal slots 144 are arranged alternately.

Figure 19:
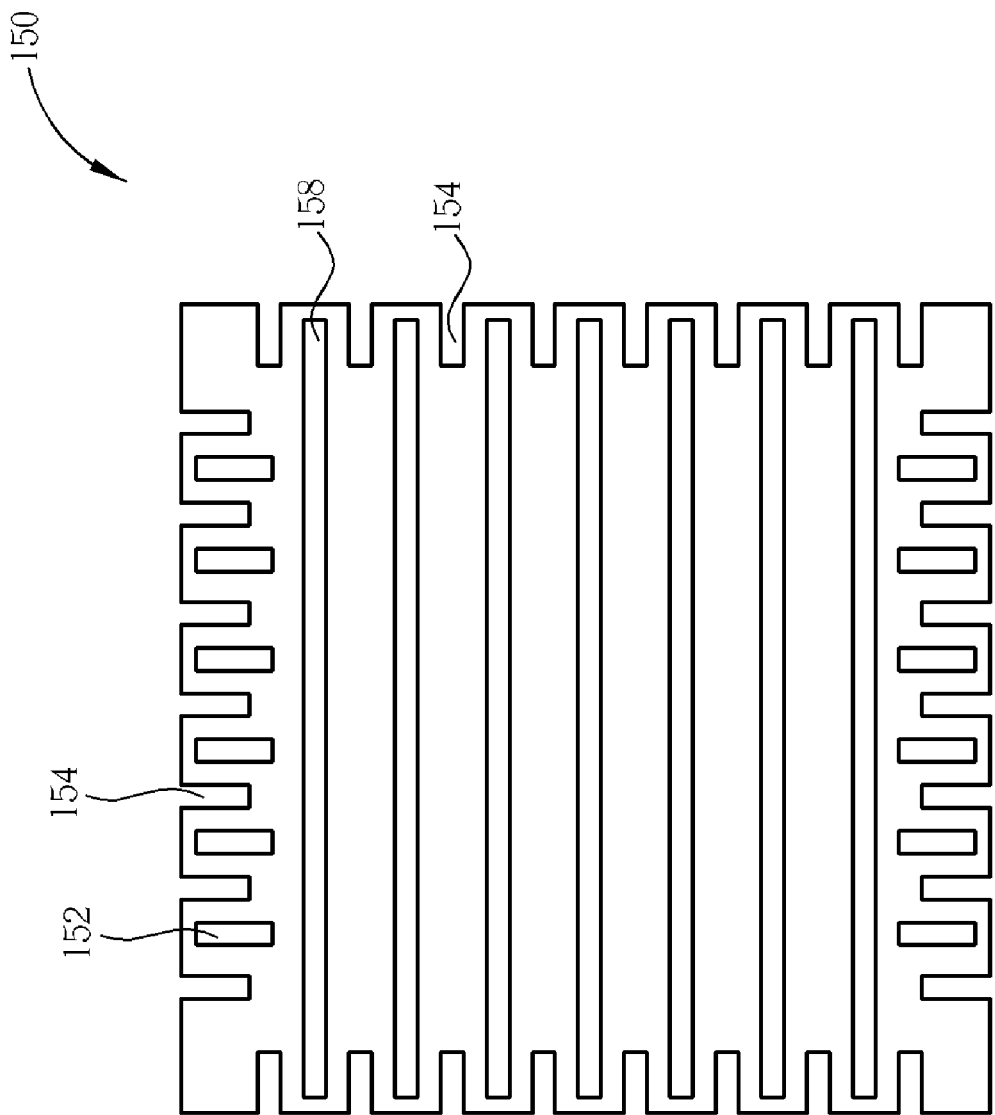

FIG. 19 illustrates a metal structure 150 including a non-continuous periphery and a plurality of central slots 158. As shown in FIG. 19, the central portion of the metal structure 150 includes a plurality of central slots 158, and the periphery portion of the metal structure 150 includes a plurality of staggered slots 152 and a plurality of marginal slots 154. The marginal slots 154 extend inward from the four sides of the metal structure 150, and the central slots 158 parallel to the scribe line. It deserves to be mentioned that, two ends of each central slot 158 are extend outward to two opposite sides of the metal structure 150, and each end of each central slot 158 is extend to the positions between the marginal slots 154. As a result, the central slots 158 and the marginal slots 154 are arranged alternately. Furthermore, the staggered slots 152 are positioned on both sides of the plurality of central slots 158. Those staggered slots 152 are located inside the metal structure 150 and between every two marginal slots 154 that are on the both sides of the plurality of central slots 158.

Besides, in order to match up the shape of the above-mentioned metal structure including a non-continuous periphery, the metal layer or the via strip under the metal structure can include an edge with a shape of sawtooth, wave or rectangular waveform which is corresponding to the upper metal structure.

Briefly speaking, because the metal structures of the semiconductor wafer in the scribe line area include the slot split, include the openings arranged in an array or include a non-continuous periphery, the metal structures become the non-continuous structure. Thus, the present invention effectively reduces the occurring probabilities of peeling and interlayer delamination of material layers, and prevents the dies from being damaged by peeling or interlayer delamination. In addition, when the wafer sawing process is performed, the slot split or the openings can be the crack stress stoppers to prevent the cracks from extending from the scribe line areas to the integrated circuits in the die areas. In addition, these metal structures can transfer the stress to the slot split or the opening, and release most of the stress.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor wafer comprising:
    a plurality of die areas, each die area surrounded by at least a first scribe line area and at least a second scribe line area;
    at least a first metal structure disposed in the first scribe line area, wherein at least a first slot split is disposed within the first metal structure and the first slot split is in a direction parallel to the first scribe line area;
    at least a second metal structure, disposed in the second scribe line area, wherein at least a second slot split is disposed within the second metal structure and the second slot split is in a direction parallel to the second scribe line area.

2. The semiconductor wafer of claim 1, wherein the first and the second metal structures both comprise a test key, a test component of feature dimension, an alignment mark, or a wafer acceptance testing (WAT) pad.

3. The semiconductor wafer of claim 1, wherein each die area comprises an integrated circuit.

4. The semiconductor wafer of claim 1, wherein the first and the second scribe line areas both comprise at least a low dielectric constant (low-k) dielectric layer.

5. The semiconductor wafer of claim 4, wherein the first and the second metal structures both are formed on a surface of the low-k dielectric layer.

6. The semiconductor wafer of claim 1, wherein the first and the second metal structures both are inlayed into the low-k dielectric layer.

7. The semiconductor wafer of claim 1, wherein the semiconductor wafer further comprises a passivation layer covering a surface of the low-k dielectric layer and the first and the second metal structures.

8. The semiconductor wafer of claim 1, wherein the first and the second metal structures both comprise titanium, tantalum, tungsten, aluminum, copper, titanium nitride, tantalum nitride, or an alloy thereof.

9. The semiconductor wafer of claim 1, wherein the first and the second metal structures both comprise a plurality of third slot splits extending inward from edges of the metal structures.

10. The semiconductor wafer of claim 9, wherein the first and the second metal structures further comprise a plurality of fourth slot splits, and the third slot splits and the fourth slot splits are arranged alternately.

* * * * *